(12) United States Patent
Feye-Hohmann et al.

(10) Patent No.: US 6,172,877 B1
(45) Date of Patent: Jan. 9, 2001

(54) DATA OR POWER BUS CONNECTABLE SUPPORT RAIL MOUNTABLE ELECTRICAL OR ELECTRONIC DEVICE WITH A SEPARATELY REMOVABLE CIRCUIT BOARD HOUSING

(75) Inventors: Jürgen Feye-Hohmann, Detmold; Hartmut Follmann, Extertal; Heinz Reibke, Bad Salzuflen, all of (DE)

(73) Assignee: Phoenix Contact GmbH & Co., Blomberg (DE)

(*) Notice: Under 35 U.S.C. 154(b), the term of this patent shall be extended for 0 days.

(21) Appl. No.: 09/180,898

(22) PCT Filed: Mar. 11, 1998

(86) PCT No.: PCT/EP98/01396

§ 371 Date: Dec. 29, 1998

§ 102(e) Date: Dec. 29, 1998

(87) PCT Pub. No.: WO98/42045

PCT Pub. Date: Sep. 24, 1998

(30) Foreign Application Priority Data

Mar. 16, 1997 (DE) .............................. 197 10 768

(51) Int. Cl.⁷ ................. H05K 7/14; H01R 9/26
(52) U.S. Cl. .............. 361/759; 361/728; 361/740; 361/753; 361/797; 361/801; 439/76.1; 439/82
(58) Field of Search .................. 361/686, 724–727, 361/728, 730, 732, 736, 752, 753, 759, 798, 801, 802, 823; 439/76.1, 82, 714–716

(56) References Cited

U.S. PATENT DOCUMENTS 4,472,764    9/1984   Andre et al. .
5,593,325    1/1997   Werner .

FOREIGN PATENT DOCUMENTS

| 502 750 | 3/1971 | (CH) . |
| 39 22 551 | 1/1991 | (DE) . |
| 44 02 001 | 7/1995 | (DE) . |
| 44 02 002 | 7/1995 | (DE) . |
| 36 33 007 | 4/1996 | (DE) . |
| 296 06 007 | 8/1996 | (DE) . |
| 296 06 759 U | 8/1996 | (DE) . |
| 0 364 618 | 4/1990 | (EP) . |
| 0 680 114 | 11/1995 | (EP) . |

*Primary Examiner*—Jayprakash N. Gandhi
(74) *Attorney, Agent, or Firm*—Nixon Peabody LLP; David S. Safran

(57) ABSTRACT

An electrical or electronic device (1) for placement on a support rail (2), with a housing (3), with at least one circuit board (4) located in the housing (3), and with contacts (6a, 6b) which point in the lengthwise direction (R) of the support rail for a data and/or power bus connection to adjacent electronic devices which have the corresponding contacts and which are placed on the support rail (2). In order to be able to easily replace the circuit board (4) without interrupting the data and/or power bus connection, the housing (3) is made in at least two parts and there is a top part (7) which holds the circuit board (4) and there is a base part (8) which has contacts (6a, 6b).

11 Claims, 9 Drawing Sheets

DATA OR POWER BUS CONNECTABLE SUPPORT RAIL MOUNTABLE ELECTRICAL OR ELECTRONIC DEVICE WITH A SEPARATELY REMOVABLE CIRCUIT BOARD HOUSING

BACKGROUND OF THE INVENTION

1. Field of the Invention

The invention relates to an electrical or electronic device with a housing, at least one circuit board and electrical contacts for placement on a support rail for data and/or power bus connection to adjacent electronic devices which have the corresponding contacts.

2. Description of Related Art

An electrical or electronic device of the initially mentioned type is already known from published German Patent Application DE 44 02 001 A1. In the known electronic device, the device can be locked onto a commercial support rail, and during locking, is automatically electrically connected with adjacent electronic devices. In this way, a bus connection arises via the connected electronic devices.

Problems arise in the known construction in the case in which the circuit board in the electrical or electronic device is defective and the electrical or electronic device must be removed from the unit for repair or replacement purposes. This automatically leads to interruption of the data and/or power bus connection.

SUMMARY OF THE INVENTION

The object of the invention is therefore to make available an electrical or electronic device of the initially mentioned type in which replacement of the circuit board is possible without interrupting the data and/or power bus connection.

This aforementioned object is achieved in electrical or electronic device of the initially mentioned type in accordance with the invention essentially in that the housing is made in at least two parts and there is a top part which holds the circuit board and there is a base part which has the contacts. The configuration of the electrical or electronic device according to the invention, because the housing can be divided, makes it possible to remove the circuit board together with the top part of the housing which holds the circuit board without interrupting the bus connection. The data and/or the power bus connection is established in the invention solely via contacts provided in the base parts, the base parts remaining on the support rail after removing the top part with the circuit board. The configuration of the invention, moreover, offers a certain modularity, since the top parts can have different widths, specifically n-times the width of the base part.

To prevent unintentional detachment of the top part from the base part, there is a first locking device between these two components. It is preferably made as a catch connection. In one advantageous embodiment, on the top part, there is a spring-loaded catch arm, while on the base part there are catch hooks which correspond to the catch arm.

It is furthermore provided in accordance with the invention that the top part can be swivelled onto the base part, the first locking device having a handle or engagement section, which can be manually activated from the outside of the housing, on the catch arm for detachment of the top part from the base part. The top part can be detached from the base part in this embodiment extremely easily by releasing only one catch connection. Via the handle or engagement section, the catch arm can be opened manually by hand or using a tool, for example, a screwdriver.

So that the base part is not detached at the same time when detaching or unlocking the top part from the base part, in the worst case, this would mean interruption of the data and/or power bus connection, there is a second, especially latchable locking device for detachable connection of the base part to the support rail. Here, it is important that the second locking device is completely independent of the first locking device so that release of the first locking device cannot unintentionally lead to release of the second locking device as well.

In order, on the one hand, to be able to easily connect the base part to the support rail, and on the other hand to prevent unintentional detachment of the base part from the support rail, it is furthermore provided that the base part can be swivelled onto the support rail and the second locking device has a spring-loaded latch on the base part for unilateral locking to the support rail.

Preferably, the latch is located in the area of the bottom of the base part, and thus, is not accessible from the outside. To open the second locking device, there is an actuation opening on the latch and there is an insertion opening for a tool, for example a screwdriver, on the top of the base part, the actuation opening being arranged offset to the insertion opening such that, when the tool is inserted into actuation and insertion opening, the latch is moved against the spring load and the base part is released. Here, it is especially expedient if the insertion opening on the base part is accessible only with the top part removed. The aforementioned configuration ensures that the second locking device cannot be released before the first locking device in any case, since first the top part must be removed to reach the top of the base part and thus the insertion opening.

So that the circuit board is properly arranged in the housing, i.e., in any case, contact is made correctly with the contacts provided in a circuit board receiver provided on the base part and thus, moreover, it is ensured that the circuit board is withdrawn at the same time as the top part is removed from the base part, according to the invention it is provided that, in the circuit board and in the top part, there are corresponding openings for insertion of at least one fixing means from the outside of the housing. To achieve a good connection, it is enough to simply insert the fixing means into the circuit board. Therefore, fixation is done solely by insertion of the fixing means from the outside into the openings in the top part and the circuit board. This insertion is only possible when the respective openings are aligned in the top part and the circuit board. When the openings are aligned, the circuit board is then located in the desired installation and contact-making position.

In order to achieve a reliable connection of the circuit board to the housing, the fixing means has at least one, but preferably two insertion legs, there being at least one thickened area on the insertion leg via which good frictional engagement with the corresponding opening in the circuit board can be achieved.

In addition to the fixing finction, the fixing means can, however, also perform another function, i.e., it can be used for electrical connection. Often feed contacts must be attached to the circuit board. This can easily be done with a corresponding design via the fixing means. For this reason, the fixing means should have at least one terminal element in the form of a lug. In this case, the insertion leg makes contact with a printed conductor on the circuit board. The electrical or electronic device then also has the function of an add-on terminal.

So that the fixing means does not laterally project over the electrical or electronic device, it is provided, in one advantageous embodiment, that the fixing means is held in a corresponding receiver in the top part. If in this embodiment the fixing means has at least one terminal element, therefore is used for connection of feed contacts, in the top part there is at least one connection opening for insertion of the feed contact into the terminal element and at least one actuation opening for actuating the terminal element.

So that the fixing means, during use of the terminal element, is not subjected to mechanical stresses which could be transferred to the circuit board, the fixing means has a leg which projects out of the terminal element and from which the insertion leg projects. On the leg there is at this point a step, while in the receiver there is a corresponding step-shaped slot in which the step of the leg adjoins the housing. Any tensile or compressive load is thus accommodated by the housing and is not transferred to the circuit board.

So that the fixing means cannot fall out of the electrical or electronic device, finally, there is a cover for the receiver which can be detachably joined to the housing, preferably which can catch.

Other features, advantages and possible applications of this invention follow from the following description of embodiments using the drawings and the drawings themselves.

DETAILED DESCRIPTION OF THE INVENTION

Figure 1:
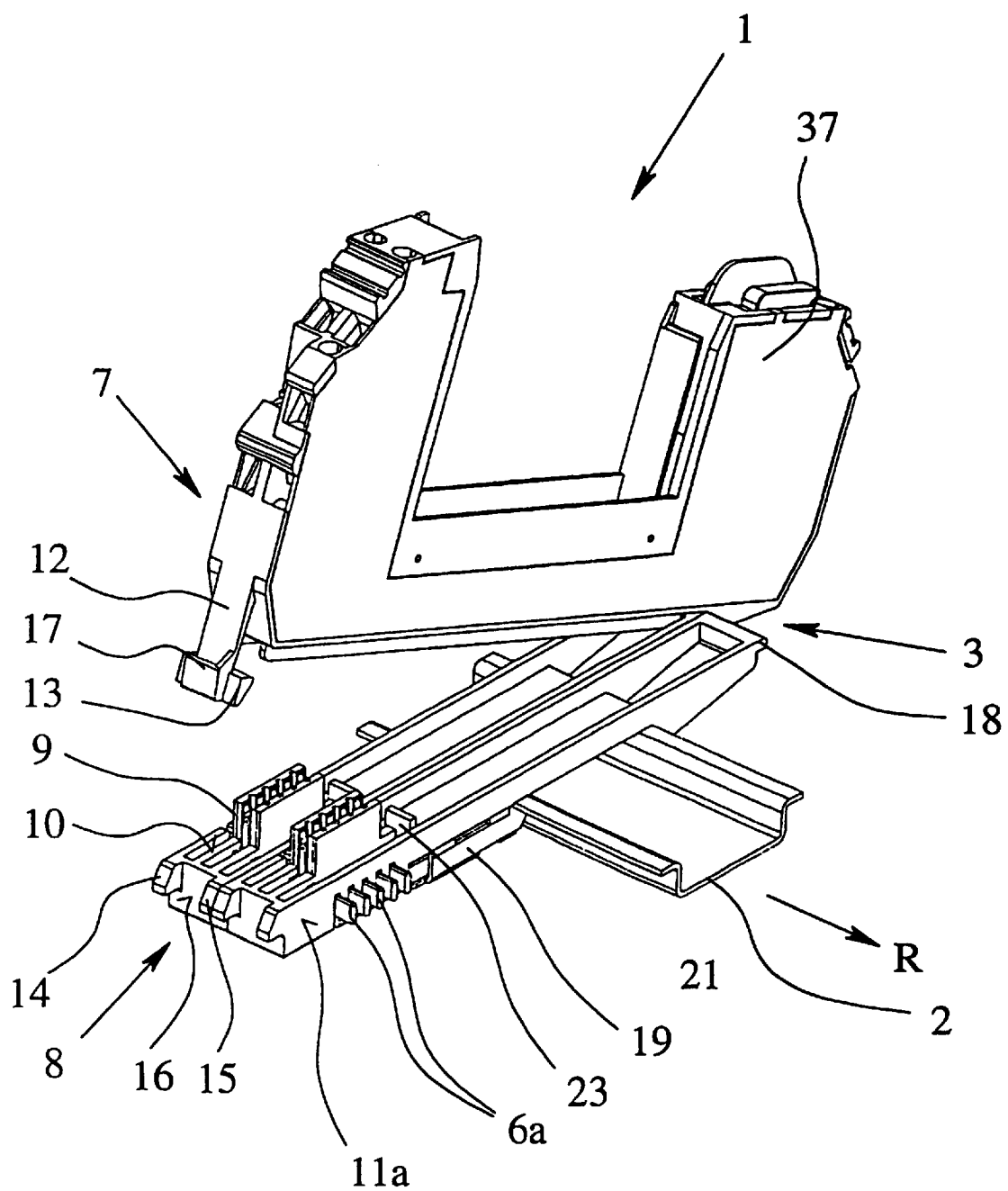
FIG. 1 is a perspective view of an electrical or electronic device in accordance with the invention placed on the support rail.
Figure 2:
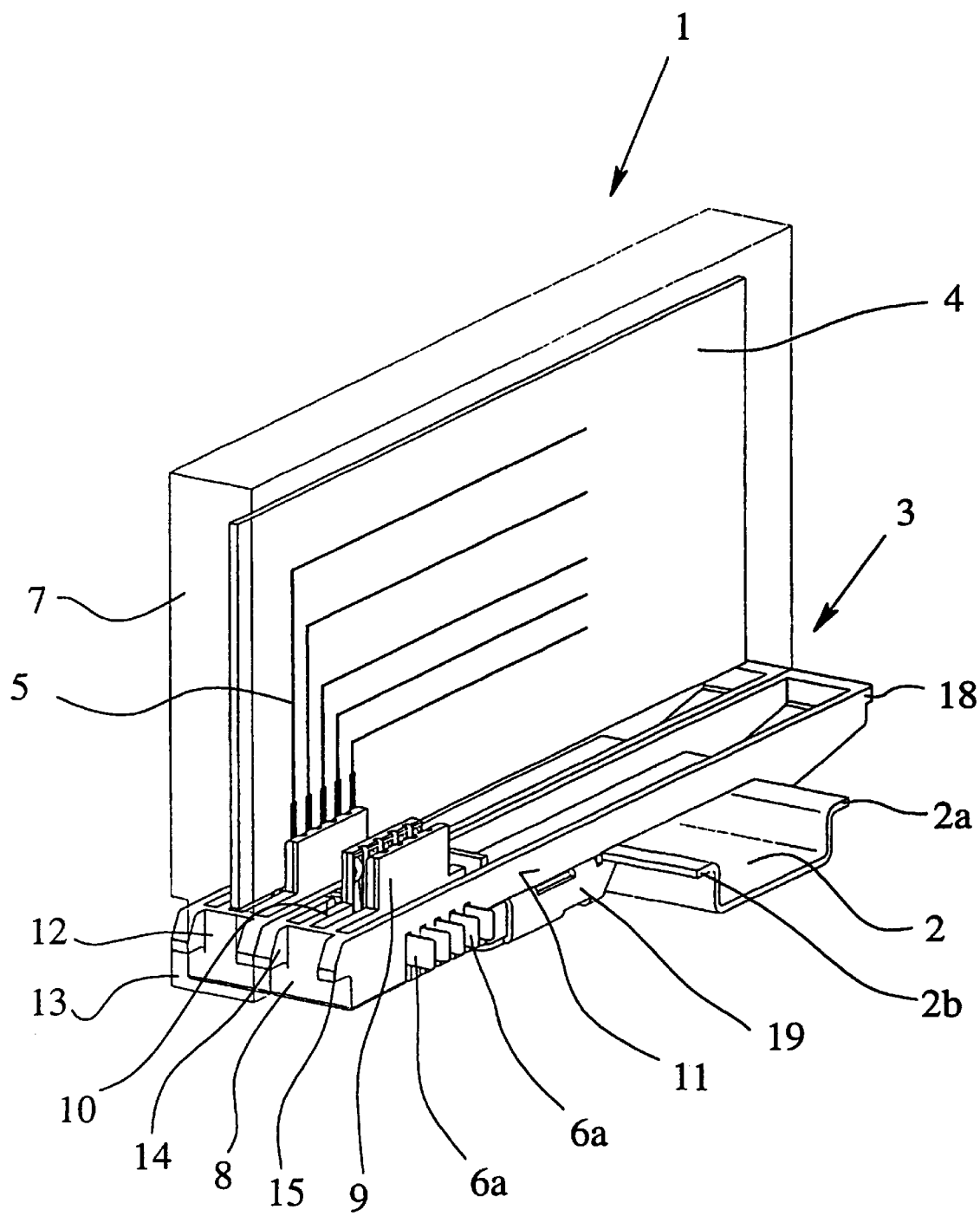
FIG. 2 is a perspective view of another embodiment of an electrical or electronic device in accordance with the invention.

The figures show an electrical or electronic device 1 which is intended to be placed on a support rail 2 made as a top hat rail. The electrical or electronic device 1 itself has a housing 3 which is made of an insulating material, especially plastic. In the housing 3, there is a circuit board 4. The circuit board 4 is conventionally provided with printed conductors 5 on both sides of the circuit board and with electronic components which are not shown in detail. Furthermore, the electrical or electronic device 1 has contacts 6a on one side 11a which are made as blade contacts and which point in the lengthwise direction R of the support rail and corresponding contacts 6b made as contact receivers on the other side 11b for a data and/or power bus connection for making contact with other adjacent electronic devices which have corresponding contacts and which are placed on the support rail 2. Electrical or electronic devices 1 of the aforementioned type can be arranged in a row next to one another on a support rail 2 based on their design, a data and/or power bus connection arising via the respective contacts 6a, 6b. The electrical or electronic device 1 shown is moreover made in the manner of an add-on terminal and is suited especially for protected use in hazardous locations.

It is significant here that the housing 3 is made in at least two parts. In this embodiment, the housing 3 has a top part 7 which holds the circuit board 4 and a base part 8 which has contacts 6a, 6b. To make contact with the base part 8, the base part has a circuit board receiver 9 which projects upwardly from the top side 10 of the base part 8. The contacts in the circuit board receiver 9 correspond to the contacts 6a, 6b in sides 11a, 11b of the base part 8.

For detachable connection of the top part 7 to the base part 8, there is a first locking device which is made as a catch connection. For this reason, the first locking device has a spring-loaded catch arm 12 which is located on the top part 7. The catch arm 12, which projects downward over top part 7, has a catch segment 13 which interacts with the two corresponding catch hooks 14, 15 which are provided on the face 16 of the base part 8. The catch hooks 14, 15 and the catch segment 13 each have contact bevels to facilitate catching. The two catch hooks 14, 15 are spaced apart so that the catch arm, in the locked state, is between the catch hooks 14, 15. To open the catch connection of the first locking device, on the end of the catch arm 12 there is an engagement section in the form of a pocket 17 into which a tool, for example, a screwdriver, is inserted and using which, the catch arm 12 can be released. While there is a catch connection on one end face of the housing 3, on the opposite end face, there is a receiving slot on the top part 7 (not shown) into which a corresponding projection 18 on the base part 8 is inserted so that the top part 7 can be swivelled onto the base part 8.

For detachable connection of the base part 8 to the support rail 2 there is a second locking device. Like the top part 7 onto the base part 8, the base part 8 can also be swivelled onto the support rail 2. For this reason, on the bottom 20 of the base part 8 there is a slot, which is not shown in detail, for engaging the corresponding projection 2a of the support rail 2. Opposite the swivel connection, on the base part 8, there is a spring-loaded latch 19 which is used for unilaterally reaching under the support rail 2 or the corresponding projection 2b of the support rail 2.

Figure 3:
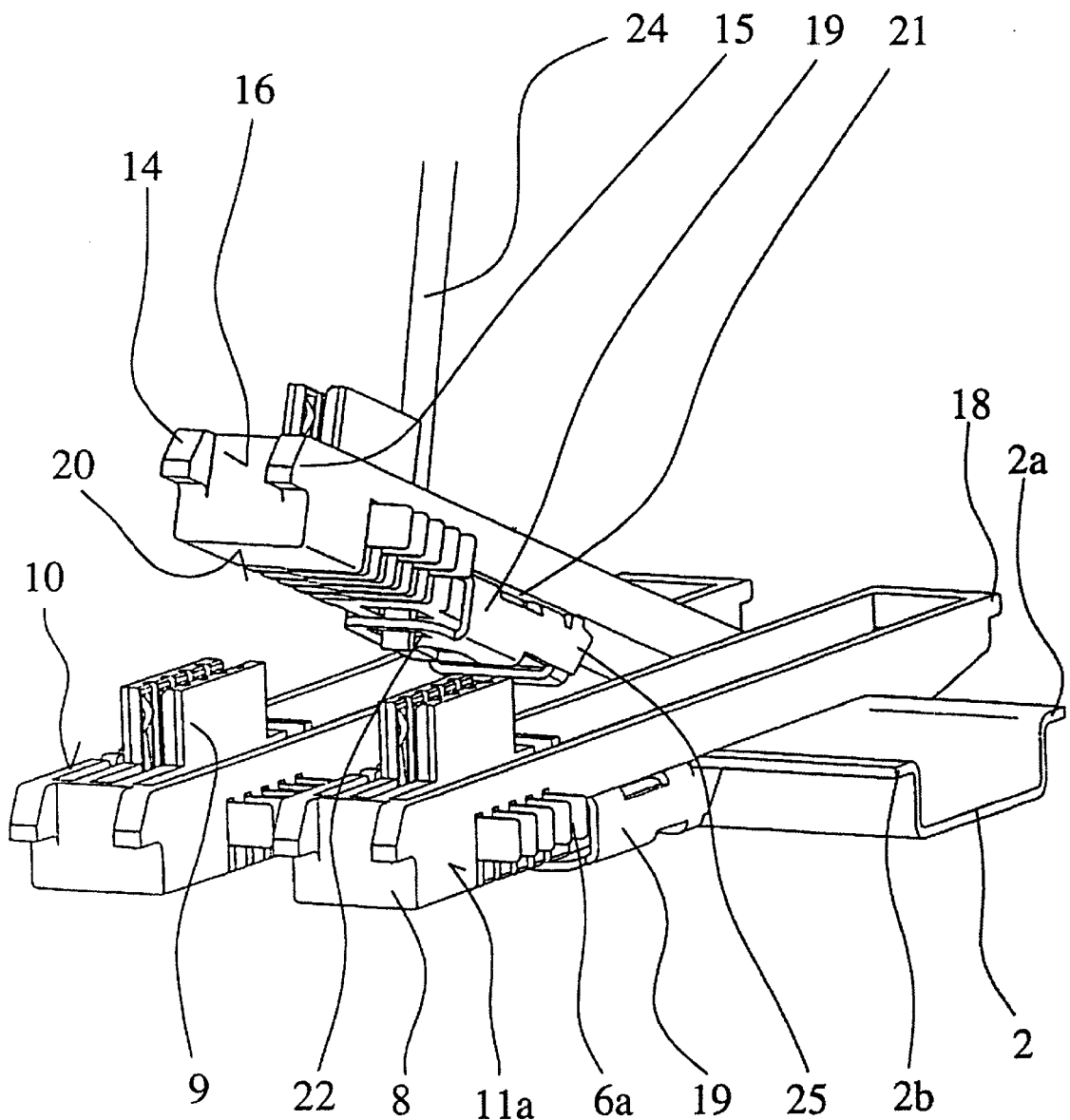
FIG. 3 is a perspective view of base parts of electrical or electronic devices in accordance with the invention.
Figure 4:
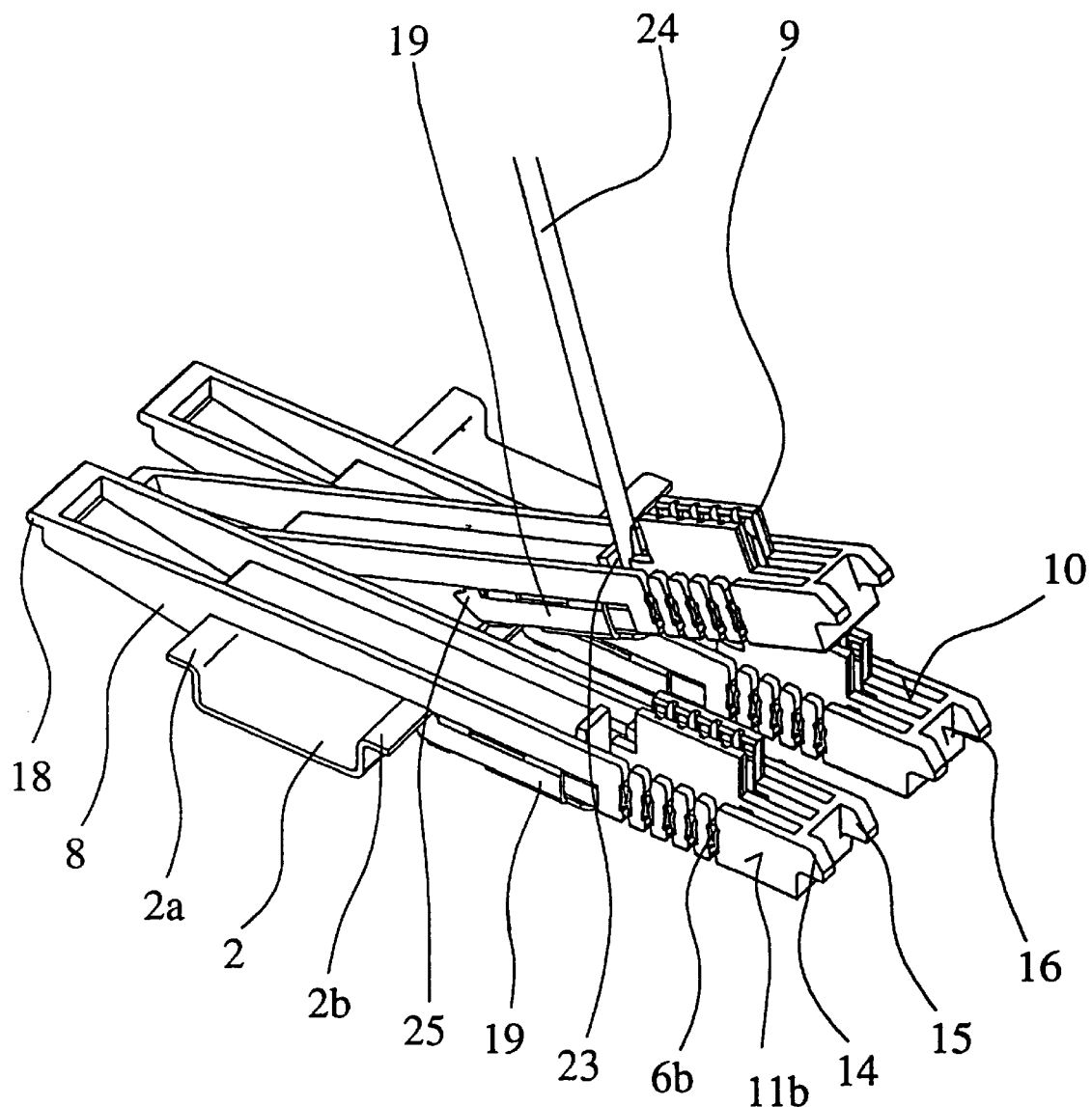
FIG. 4 is another perspective view of base parts of electrical or electronic devices in accordance with the invention.

The latch 19 is located on the bottom 20 of the base part 8. The latch 19 is roughly U-shaped and extends over the entire bottom 20 of the base part 8. The top ends of the U-legs are bent onto one another and each fits into a corresponding slot 21 on sides 11a, 11b on the base part 8. In this way, the latch 19 is held captive on the base part 8. On the latch 19, there is an actuating opening 22, while in the base part 8 there is a through insertion opening 23 which is accessible from the top 10 for a tool 24, such as a screwdriver (compare especially FIGS. 3 and 4). The insertion opening 23 is only accessible when the top part 7 has been removed from the base part 8. In the locked state in which the latch 19 with its locking section 25 fits under the projection 2b of the support rail 2, the actuating opening 22 and the insertion opening 23 are arranged offset to one another, insertion of the tool 24 into the actuating opening 22 however still being possible. By continued insertion of the tool 24, the actuation opening 22 opens into the insertion opening 23, the latch 19 being moved against the spring load until the locking section 25 no longer fits under the corresponding projection 2b of the support rail 2 and the base part 8 can thus be swung away from the support rail 2.

The circuit board 4 itself is held in the housing 3 or in the top part 7 of the housing 3 in a guide which also facilitates the insertion of the circuit board 4 during installation. As follows especially from FIGS. 5 to 9, in the circuit board 4 and in the top part 7 there are corresponding openings 26 which are used for insertion of at least one fixing means 27 from the outside of the housing 3. Although the use of fixing means 27 is, of course, especially advantageous in conjunction with the two-part housings 3 of the type in accordance with the invention, there can also be fixing means 27 for fixing the circuit board 4 in a one-part housing 3, as is shown in FIG. 6. The connection of the individual fixing means 27 to the circuit board 4 takes place solely via insertion, without the need for other connection, especially soldering.

Figure 5:
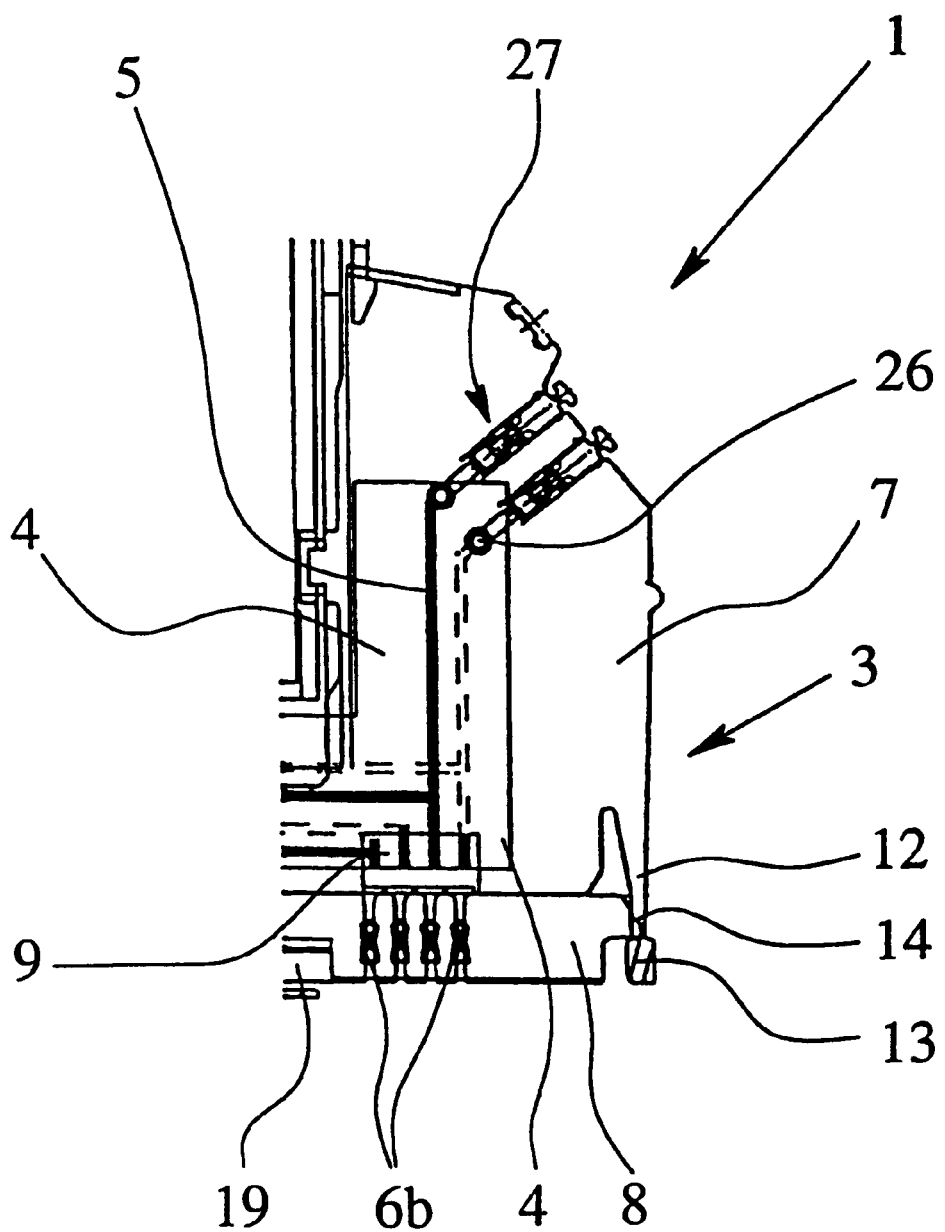
FIG. 5 is a front view in a section of one part of an electrical or electronic device in accordance with the invention.
Figure 6:
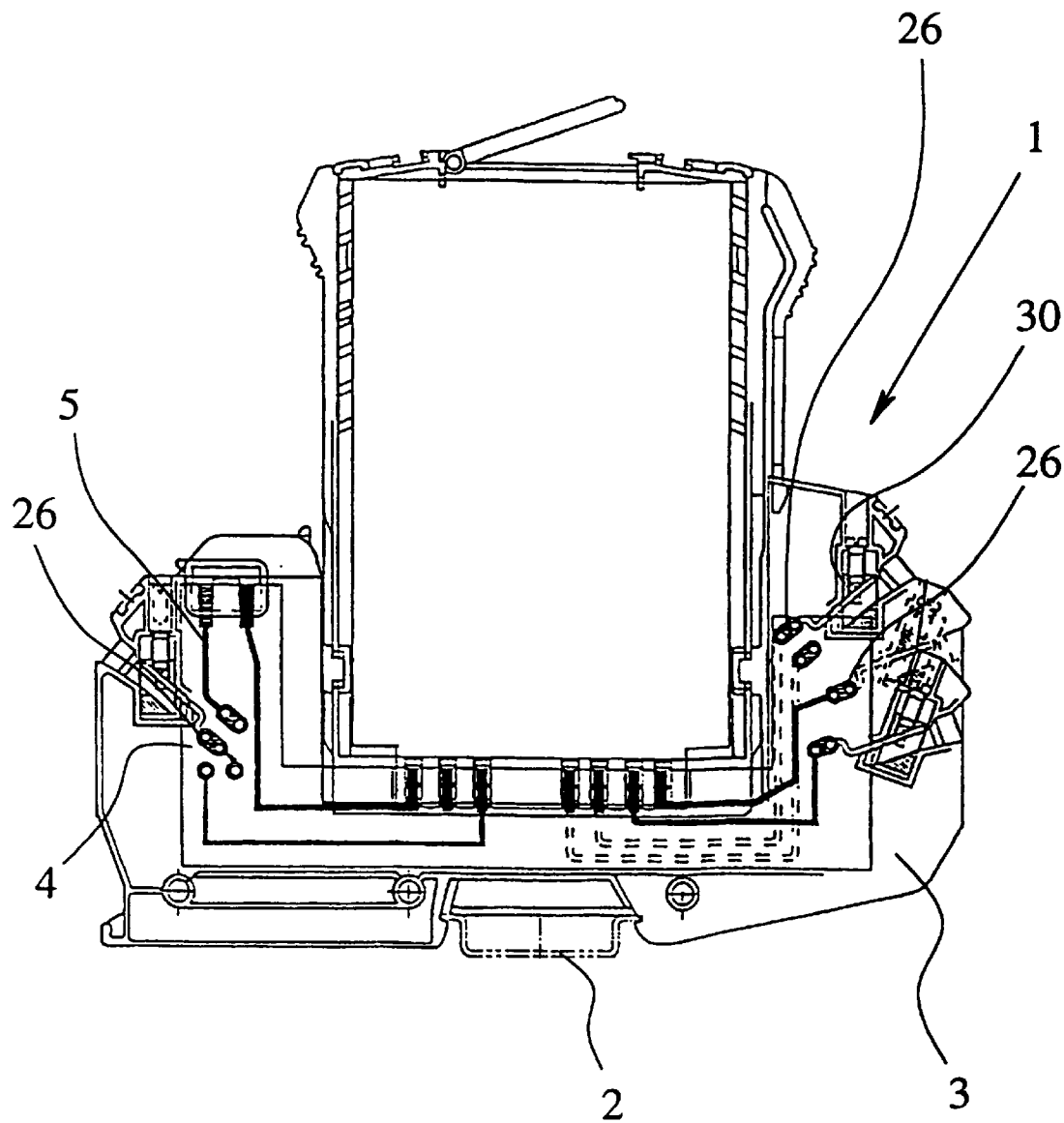
FIG. 6 is a front view in a section of another embodiment of an electrical or electronic device as claimed in the invention.
Figure 7:
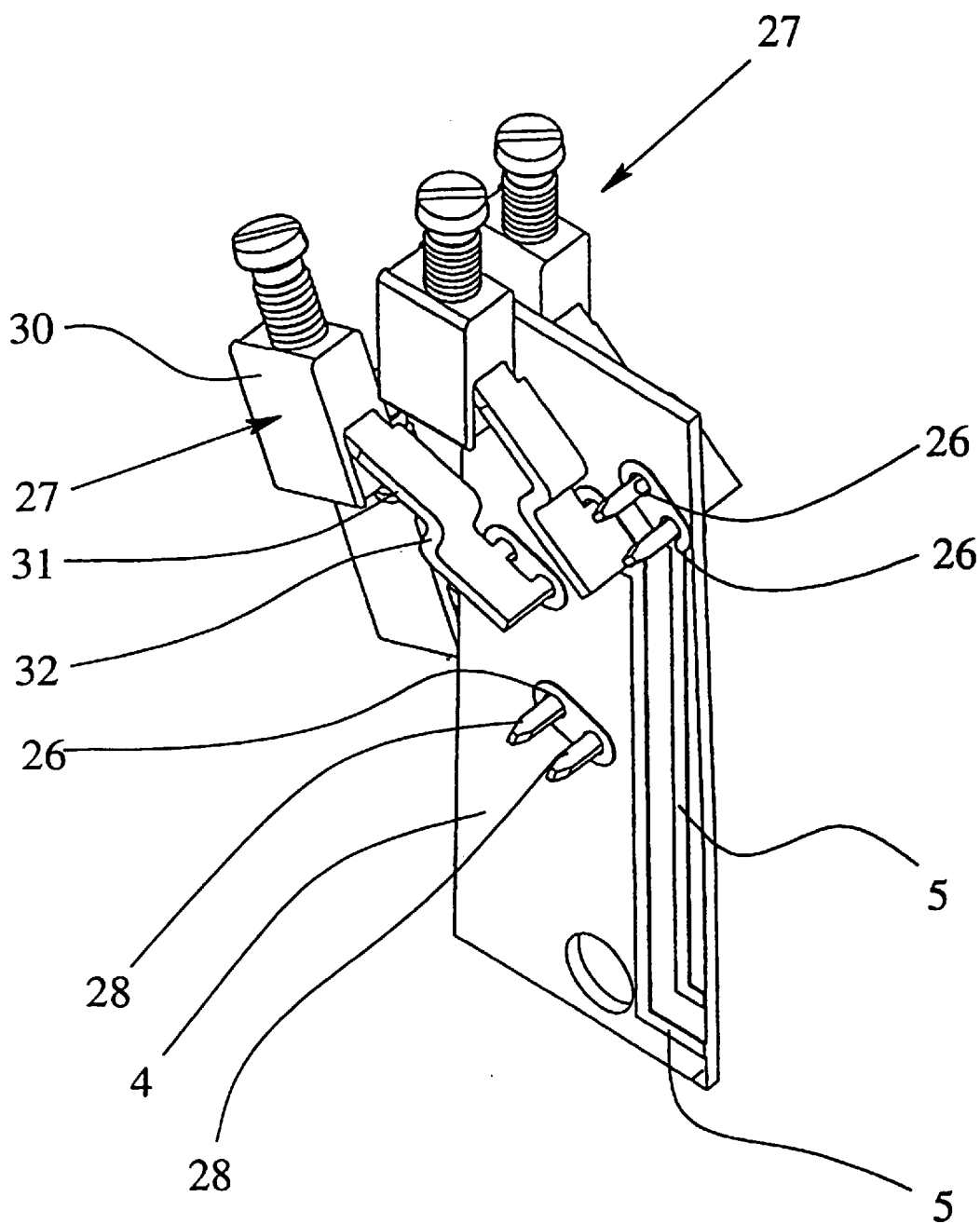
FIG. 7 is a perspective view of the type of fixing of the circuit board of an electrical or electronic device in accordance with the invention, with the housing omitted.
Figure 8:
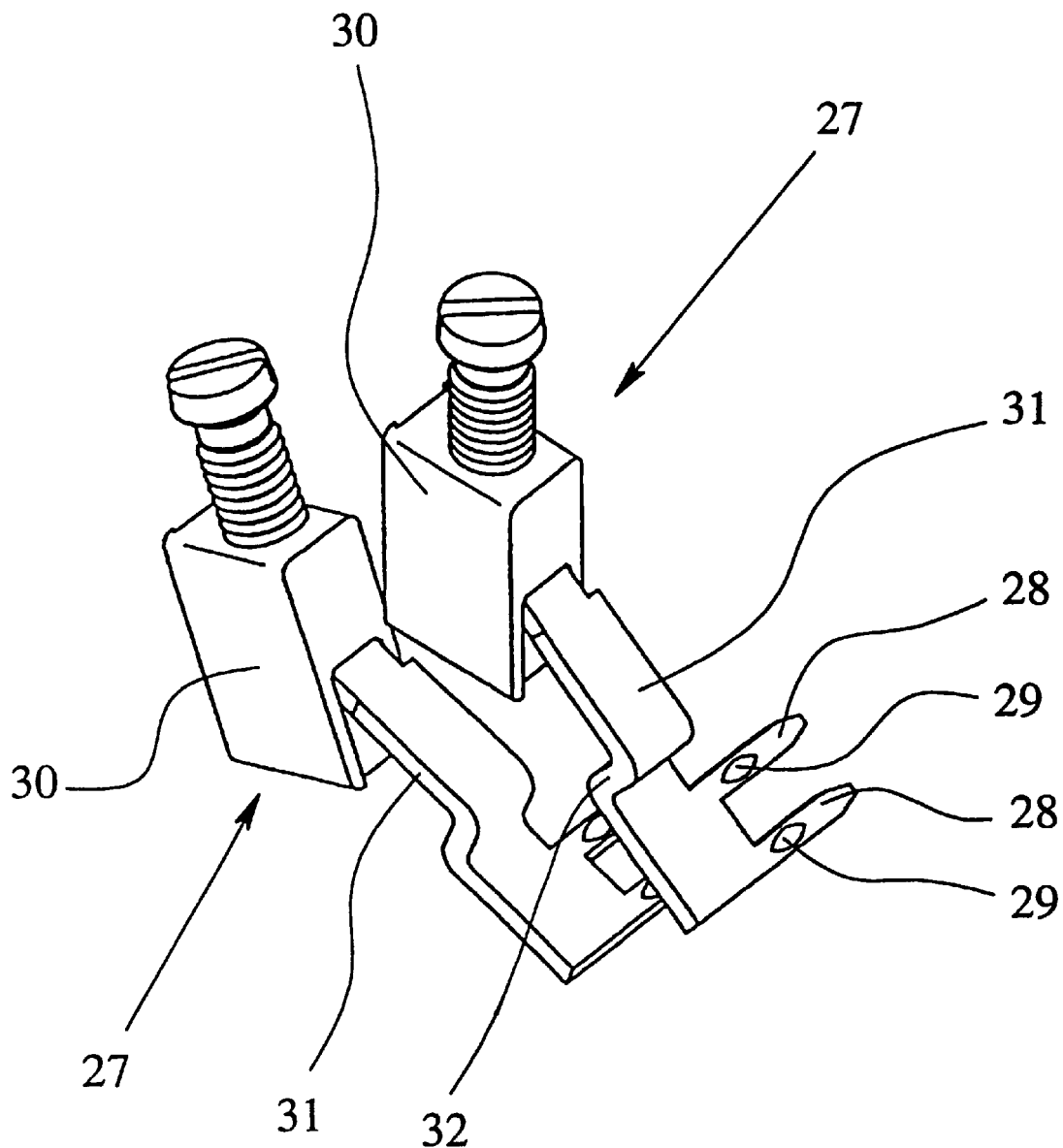
FIG. 8 is a perspective view of two fixing means for fixing the circuit board.
Figure 9:
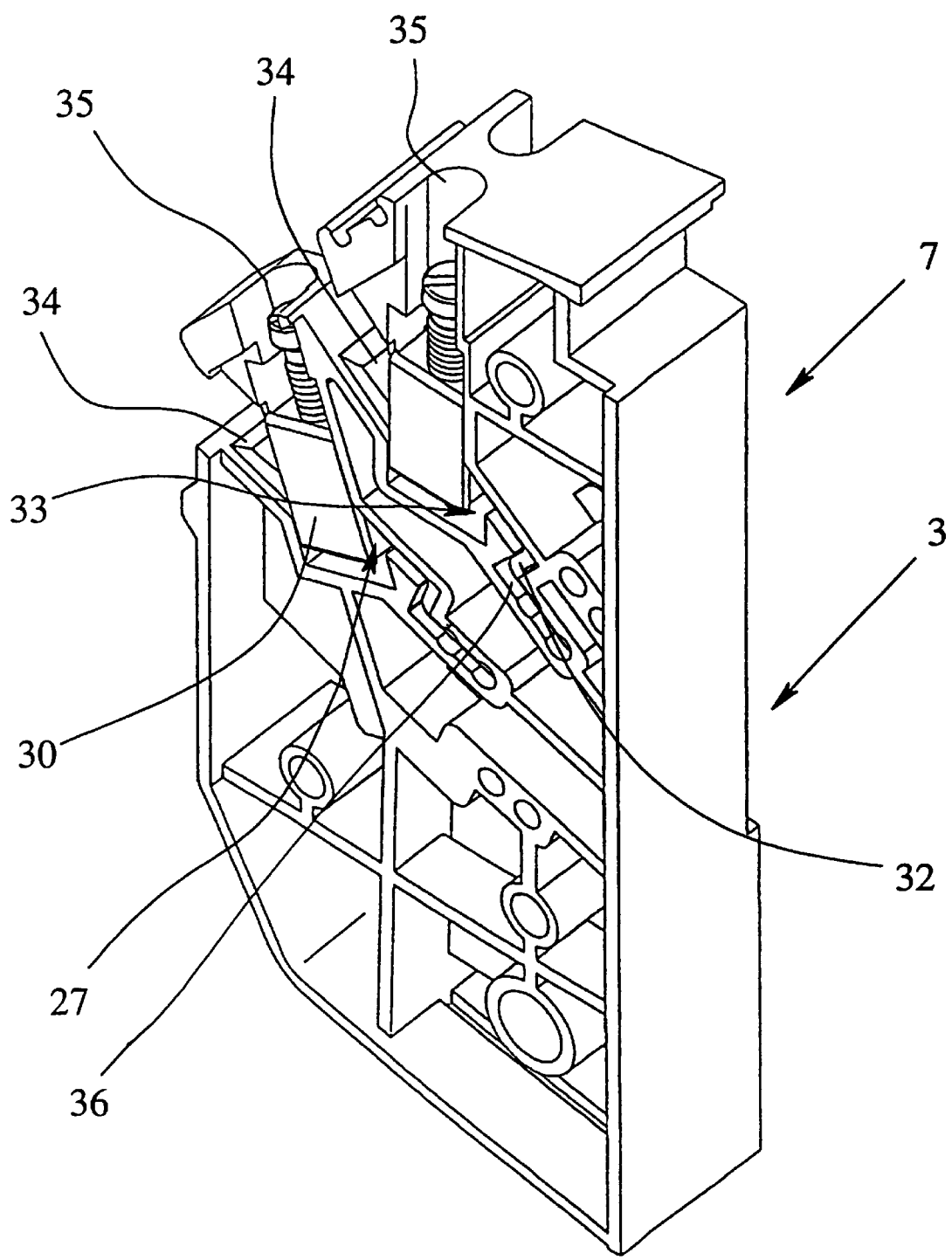
FIG. 9 is a perspective view of part of the housing of an electrical or electronic device in accordance with the invention.

For insertion purposes, the fixing means 27 in the embodiment shown in FIG. 5 has an insertion leg 28, while in the embodiments shown in FIGS. 6 to 9 there are two insertion legs 28 per fixing means 27. The insertion legs 28 run at roughly a right angle to the plane of the circuit board 4 and thus coaxially to the direction R of the support rail 2. Since the individual insertion legs 28 are simply inserted into the circuit board 4, to improve the plug connection there is at least one thickened area 29 (FIG. 8) on the insertion leg 28.

In addition to their fixation function, individual fixing means 27 are also used for connection of feed contacts. For this purpose, on the end of the fixing means 27 opposite the insertion leg 28 there is a terminal element 30. The terminal element 30 shown in FIGS. 6 to 9 is a screw terminal here. The openings 27 are each located in the area of the printed conductors 5 so that when an insertion leg 28 is inserted, contact is made with the appropriate printed conductor 5.

The contact leg present in the terminal element 30 is routed out of the terminal element 30 as a leg 31. The insertion legs 28 are extend from the leg 31 roughly at a right angle. Before the insertion legs 28, a step 32 is made on the leg 31.

The fixing means 27 are accommodated in the corresponding receivers 33 in the housing 3 or in the top part 7 of the housing 3. For connection of the feed contacts, for each fixing means 27, there is a connection opening, and for actuating the terminal element 30, there is a respective actuation opening 35. Corresponding to step 32 on the leg 31, there is otherwise in the receiver 33 a corresponding step-shaped slot 36 in which the step 32 adjoins the housing 3 so that any compressive and tensile loads are transferred to the housing 3.

In order to be able to close the receiver 33, the housing 3 or the top part 7 has a cover 37 (FIG. 1) which can be detachably connected to the housing 3 or the top part 7, in particular can be locked to it.

What is claimed is:

1. Electrical or electronic device for placement on a support rail, comprising a housing at least one circuit board located in the housing, and with contacts for a data and/or power bus connection to adjacent electronic devices which have the corresponding contacts and which are also mountable on the support rail; wherein the housing is made in at least two parts, one of which is a top part which holds the circuit board and another of which is a base part which has said contacts, said contacts comprising a blade contact on one side of the base part and a blade receiver contact on an opposite side of the base part; wherein a first locking device is provided for detachable connection of the top part to the base part; wherein a second locking device is provided for detachable connection of the base part, in use, to the support rail; and wherein the second locking device is in a position which is inaccessible for releasing thereof until the first locking device is released and the top part removed.

2. Electrical or electronic device as claimed in claim 1, wherein the first locking device has at least one spring-loaded catch arm and catch hooks which correspond to the catch arm; and wherein the catch arm is on the top part and the are catch hooks are on the base part.

3. Electrical or electronic device as claimed in claim 1, wherein the top part can be swivelled onto the base part; and wherein the first locking device has a section on the catch arm which is manually actuatable from outside of the housing for detachment of the top part from the base part.

4. Electrical or electronic device as claimed in claim 1, wherein the base part can be swivelled onto the support rail; and wherein the second locking device has a spring-loaded latch which is held to slide on the base part for unilateral locking to the support rail in use.

5. Electrical or electronic device as claimed in claim 3, wherein the latch is located in an area of the bottom of the base part; wherein there is an actuation opening on the latch and there is a continuous insertion opening for a tool on the base part that is accessible from the top of the base part; and wherein the actuation opening, in a locked state of the base part, is arranged offset relative to the insertion opening such that, when the tool is inserted, the actuation opening becomes larger, the latch is moved against the spring load and the base part is released.

6. Electrical or electronic device as claimed in claim 1, wherein there are the corresponding openings in the circuit board and in the top part for insertion of at least one fixing means from outside of the housing; and wherein the fixing means is simply inserted into the circuit board for connection to the circuit board without being further connected to the circuit board.

7. Electrical or electronic device as claimed in claim 6, wherein the fixing means has at least one insertion leg extending at a right angle to the circuit board; and wherein there is at least one thickened area on said at least one insertion leg.

8. Electrical or electronic device as claimed in claim 6, wherein the fixing means has at least electrical connection terminal element; and wherein said at least one insertion leg makes electrical contact with at least one printed conductor of the circuit board.

9. Electrical or electronic device as claimed in claim 6, wherein the fixing means is held in a corresponding receiver in the top part; wherein there is at least one connection opening in the top part; and wherein there is at least one actuation opening for the terminal element.

10. Electrical or electronic device as claimed in claim 9, wherein the fixing means has a projecting leg which extends from the terminal element and from which said at least one insertion leg projects; and wherein on the projecting leg is formed with a step and wherein there is a corresponding step-shaped slot in the receiver which adjoins the housing and in which the step of the projecting leg is located.

11. Electrical or electronic device as claimed in claim 10, further comprising a cover for the receiver; and wherein the cover is detachably joined to the housing.

* * * * *